United States Patent [19]

Brune

[11] Patent Number: 5,652,505

[45] Date of Patent: Jul. 29, 1997

[54] POWER CONSUMPTION MEASUREMENT DEVICE FOR A MULTIPHASE ALTERNATING CURRENT SYSTEM

[75] Inventor: Fred H. Brune, Mtn. View, Calif.

[73] Assignee: Neilsen-Kuljian, Inc., Mtn. View, Calif.

[21] Appl. No.: 574,311

[22] Filed: Dec. 18, 1995

[51] Int. Cl.[6] .............................. G01R 19/00; G01R 21/06
[52] U.S. Cl. ........................... 324/107; 324/108; 324/142
[58] Field of Search ..................... 324/107, 108, 324/86, 142; 361/76, 77; 364/483

[56] References Cited

U.S. PATENT DOCUMENTS

| | | | |
|---|---|---|---|
| 1,684,056 | 9/1928 | Evans | 324/108 |
| 2,503,598 | 5/1950 | Simkins | 324/108 |
| 4,021,704 | 5/1977 | Norbeck | 361/77 |
| 4,156,186 | 5/1979 | Wolfinger | 324/108 |
| 4,485,343 | 11/1984 | Milkovic | 324/107 |
| 4,535,287 | 8/1985 | Milkovic | 324/107 |
| 4,595,988 | 6/1986 | Chiffert et al. | 324/107 |
| 4,641,090 | 2/1987 | Danby | 324/107 |
| 4,659,974 | 4/1987 | Bax et al. | 324/86 |
| 4,761,605 | 8/1988 | Jochum | 324/142 |
| 5,017,860 | 5/1991 | Germer et al. | 324/107 |
| 5,184,063 | 2/1993 | Eisenhauer | 324/108 |
| 5,378,979 | 1/1995 | Lombardi | 324/107 |

FOREIGN PATENT DOCUMENTS 2149128  6/1985  United Kingdom.

*Primary Examiner*—Ernest F. Karlsen
*Attorney, Agent, or Firm*—Thomas A. Powers; Chandrakant C. Shroff; Papan Devnani, Esq.

[57] ABSTRACT

Disclosed is a watt/watthour meter which is capable of automatically correcting incorrect connections between the apparatus and a multiphase AC system. Each power line of the multiphase system is connected to the watt/watthour meter by means of a voltage input line and a current sensing coil. The apparatus is able to determine whether a given voltage input line is connected to the same power line as a given current sensing coil by determining whether the voltage applied to the given voltage input line has the same phase as the current running through the given current sensing coil. If the current and the voltage are the same, this information is stored, and the given voltage input line may be taken as being connected to the same power line as the given current sensing coil.

11 Claims, 4 Drawing Sheets

POWER CONSUMPTION MEASUREMENT DEVICE FOR A MULTIPHASE ALTERNATING CURRENT SYSTEM

FIELD OF THE INVENTION

This invention relates to the field of instruments for measuring power in a multiphase alternating current (AC) system, and more particularly, to instruments having the capacity to measure both current and voltage in a single phase of the AC multiphase system and multiply the measured current and voltage to derive a measurement of the power in the single phase of the AC multiphase system.

BACKGROUND OF THE INVENTION

A multiphase alternating current system may be set up in either of two ways. In a conventional three-phase, three wire system, three power lines are used to connect a three-phase alternating current AC power source to a load. A first one of the power lines carries a current $I_1$ and a voltage $V_{13}$, where the voltage of the first power line is measured relative to the potential of a third power line, and a second power line carries a current $I_2$ and a voltage $V_{23}$, where $V_{23}$ is measured relative to the potential of the third power line. The total power applied to the load, p, is known to be:

$$P = V_{13}I_1 + V_{23}I_2$$

This system is further characterized in that the voltage applied to each one of the first and second power lines is substantially in phase with the current being carried by that power line.

A similar multiphase system which has four lines is also known. In a three-phase, 4 wire system, a three-phase AC power source is connected to a load by means of a set of three power lines and a neutral, or reference, line. Each of the power lines carries a current and a voltage, where the voltage in each line is measured relative to the potential of the neutral line. The total power applied to the load by the multiphase system, P, is derived according to the equation:

$$P = V_1I_1 + V_2I_2 + V_3I_3,$$

where $V_1$ the voltage applied to a first power line; $V_2$ is the voltage applied to a second power line; $V_3$ is the voltage applied to a third power line; and $I_1$, $I_2$ and $I_3$ represent the currents flowing through the first power line, the second power line, and the third power line, respectively. Once again, the voltage applied to any one of the power lines is substantially in phase with the current flowing through that power line.

In the three-phase, three-line system, the voltage applied to the first power line is 120° out of phase with the voltage applied to the second power line. Similarly, in the three-phase, four-line system, the voltage applied to the first power line is 120° C. out of phase with the voltage applied to the second power line and 240° C. out of phase with the voltage applied to the third power line.

It is important to be able to measure the power demand on a multiphase AC power system like those described above. This may be done by connecting a watt/watthour meter to the multiphase system. A schematic illustration showing how to connect said watt/watthour meter to the multiphase system is presented in FIG. 1. The multiphase system is a three phase, four wire system connecting a three-phase AC generator 1 to a load 2 as previously described. Each of the three power lines 4, 5 and 6 is individually connected to the watt/watthour meter by one of the voltage input lines 7, where each of the lines 7 leads to one of a set of three voltage input terminals 8, 9 and 10. Each of the power lines is further connected to one of the current sensing coils 11, 12 and 13, where the current sensing coil is (a) inductively coupled to the power line so as to cause a current which is proportional to the current in the power line to flow through the current sensing coil and (b) electrically connected to the watt/watthour meter by one of a set of current input terminals 14, 15 and 16. Additionally, the neutral line 3 is connected to a reference voltage input terminal 3a by input line 7a. Each of the voltage input terminals is designated by the watt/watthour meter as being connected to a power line having a voltage of a specific phase applied thereto, and each of the current input terminals is designated as being connected to the same power line as a specific voltage input terminal.

The watt/watthour meter measures the voltage applied to a voltage input line which is connected to a designated voltage input terminal. Next, the watt/watthour meter measures the current flowing through the current sensing coil which is connected to the current input terminal which is designated as being connected to the same power line as the designated voltage input terminal. The measured current and the measured voltage are then multiplied to obtain a measure of power. The power in each phase of the system is individually measured, and all measured single-phase powers may then be added together to obtain the total power in the system.

It is essential that the voltage input line and the current sensing coil connected to a specific power line carrying a voltage and current of a given phase be connected to the voltage input terminal and current input terminal which are designated as receiving inputs from that specific power line. Otherwise, the watt/watthour meter will calculate an incorrect value for the power in that power line. For example, if the current sensing coil is connected to the wrong current input terminal, the watt/watthour meter will multiply the voltage applied to the specific power line by the current flowing through a current sensing coil which is coupled to a different power line.

In most cases, it is not known which of the voltage input lines and current sensing coils is connected to a given power line. This necessitates a great deal of trial and error in making proper connections between a watt/watthour meter and the power lines in a multiphase systems.

Additionally, the current running through a current sensor coil is often inverted in phase so that it is now 180° C. out of phase with the voltage in the voltage input line which is connected to the same power line as the current sensing coil. If this phase-inverted current is multiplied by the voltage applied to the voltage input line, a negative power is incorrectly computed. To correct this problem, the phase of the current in each current sensing coil must be compared to the phase of voltage applied to the corresponding voltage input line. If a phase mismatch is detected between the current in one of the current sensing coils and its corresponding voltage, a phase invertor or other means for correcting current phase must be connected between the current sensing coil and the current input terminal so that the measured current is in phase with the corresponding voltage.

The process of current phase correction and the trial-and-error process of connecting the proper voltage input line or current sensing coil to each of the input terminals on the watt/watthour meter makes connection of a watt/watthour meter to a multiphase AC system a tedious and frustrating process. There is a longfelt need in the art for a watt/watthour meter of automatically correcting incorrect connections between the watt/watthour meter and the power lines in the AC system. Similarly, there is a longfelt need in the art for a watt/watthour meter which can automatically correct a phase mismatch between a current in a current sensing coil connected inductively to a power line and a voltage applied to a voltage input line which is connected to the same power line.

Although the preceding discussion of watt/watthour meters is limited to their use with a three phase, 4 wire AC system, everything that has been said is equally applicable to watt/watthour meters for use with three phase, three wire systems. The only difference in the connection between the watt/watthour meter and the system is that a third power line is disconnected from its voltage input and current input terminals and reconnected to the reference voltage input terminal. The voltage of each of the remaining power lines is then determined relative to the potential of the third power line. A neutral line is not present.

SUMMARY OF THE INVENTION

It is an object of this invention to provide an improved watt/watthour meter for measuring power in a multiphase AC system, where said apparatus is capable of automatically correcting incorrect connections between the apparatus and a power line in the multiphase system.

It is a further object of this invention to provide a watt/watthour meter which is capable of correcting phase inversion of the current flowing through a current sensing coil by comparing the phase of the current in a coil which is connected to a specific power line to the phase of the voltage in a voltage input line which is connected to the same power line to determine whether they are 0° or 180° out of phase and, if they are 180° out of phase, inverting the phase of the current so that it is in phase with the voltage.

The first of these objects is accomplished by providing an apparatus which comprises:

a) a plurality of voltage input lines, where each voltage input wire is adapted to have a voltage applied thereto, where the voltage applied to any one of the voltage input lines is different in phase from the voltage applied to each of the remaining voltage input wires;

b) a plurality of current sensing coils, each coil being adapted to be inductively coupled to a different power line in a multiphase AC system so as to cause a current to flow therein further characterized in that the phase of the current in each current sensing coil corresponds to the phase of the voltage applied to one of the voltage input lines;

c) a means for automatically determining which of the current sensing coils carries a current having a phase corresponding to the phase of the voltage applied to a selected one of the voltage input lines by comparing the phase of the current in each coil to the phase of the voltage in the selected voltage input line; identifying a current sensing coil having a current having a phase which corresponds to the phase of the voltage in the selected voltage input line; and storing the information that the phase of the voltage in the selected voltage input line corresponds to the phase of the current in the identified current sensing coil; and, d) a means for measuring the voltage in the selected voltage input wire and the current in the identified current sensing coil, and multiplying this voltage and this current to obtain a measure of power in a single phase of the multiphase system.

The invention additionally comprises a means for adding the power in a given phase of the system to the power in all remaining phases in the system to obtain the total power demand on the multiphase system.

In this discussion, when a current phase and a voltage phase are identified as corresponding to each other, it should be understood that they differ by either 0° or 180° Also, when a voltage input line is identified as carrying a voltage which corresponds in phase to the current carried by a current sensing coil, the input line and the coil may be said to be aligned.

The second object of this invention is met by providing the apparatus described above with a means for determining whether the current in the identified current sensing coil is 0° or 180° out of phase with the voltage in the selected voltage input line and inverting the phase of the current if the current and the voltage are determined to be 180° out of phase.

DETAILED DESCRIPTION OF THE PREFERRED EMBODIMENTS

Figure 1:
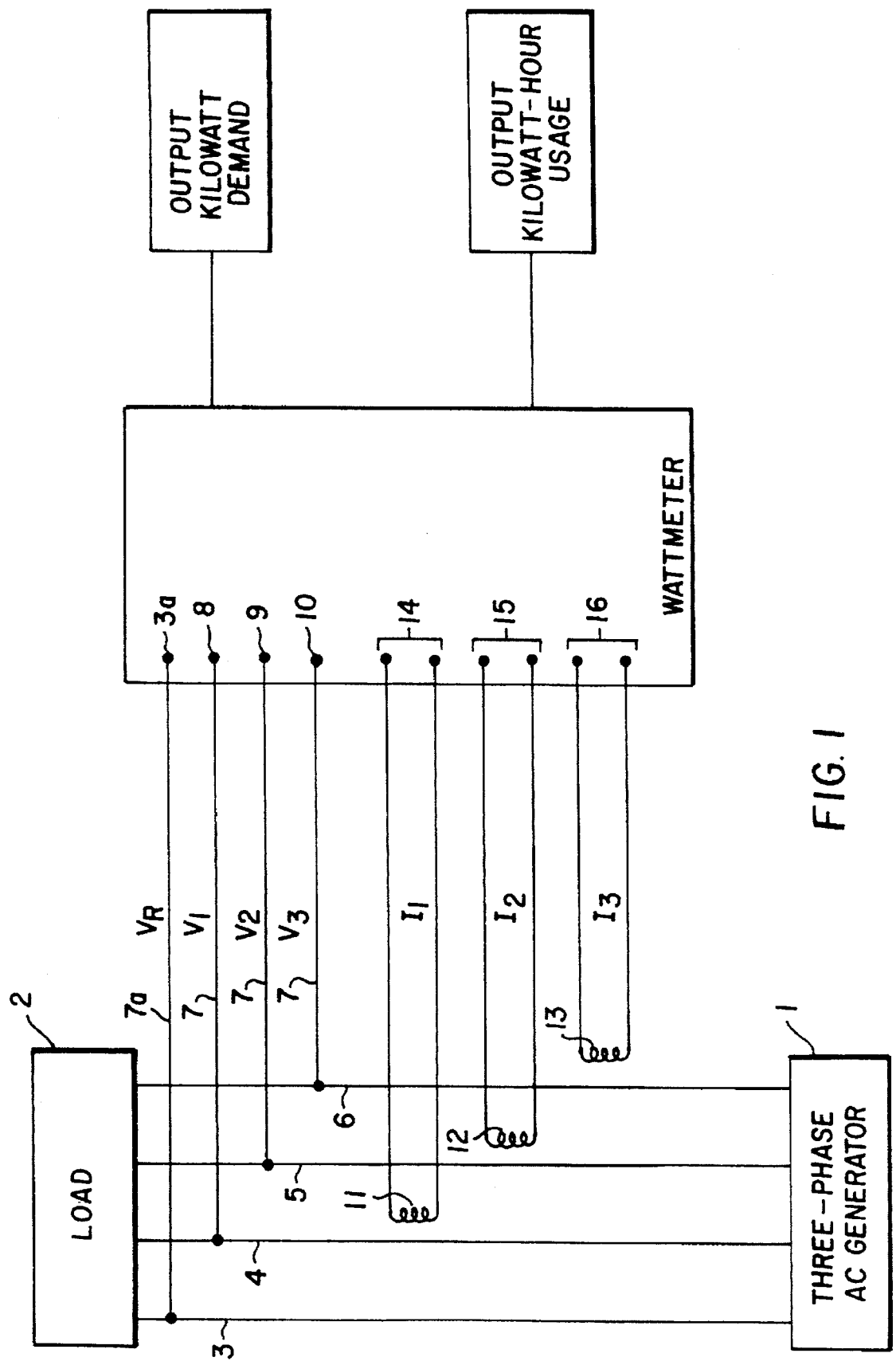
FIG. 1 provides a schematic illustration showing how to connect a conventional watt/watthour meter to a three phase, four wire multiphase alternating current system.
Figure 2:
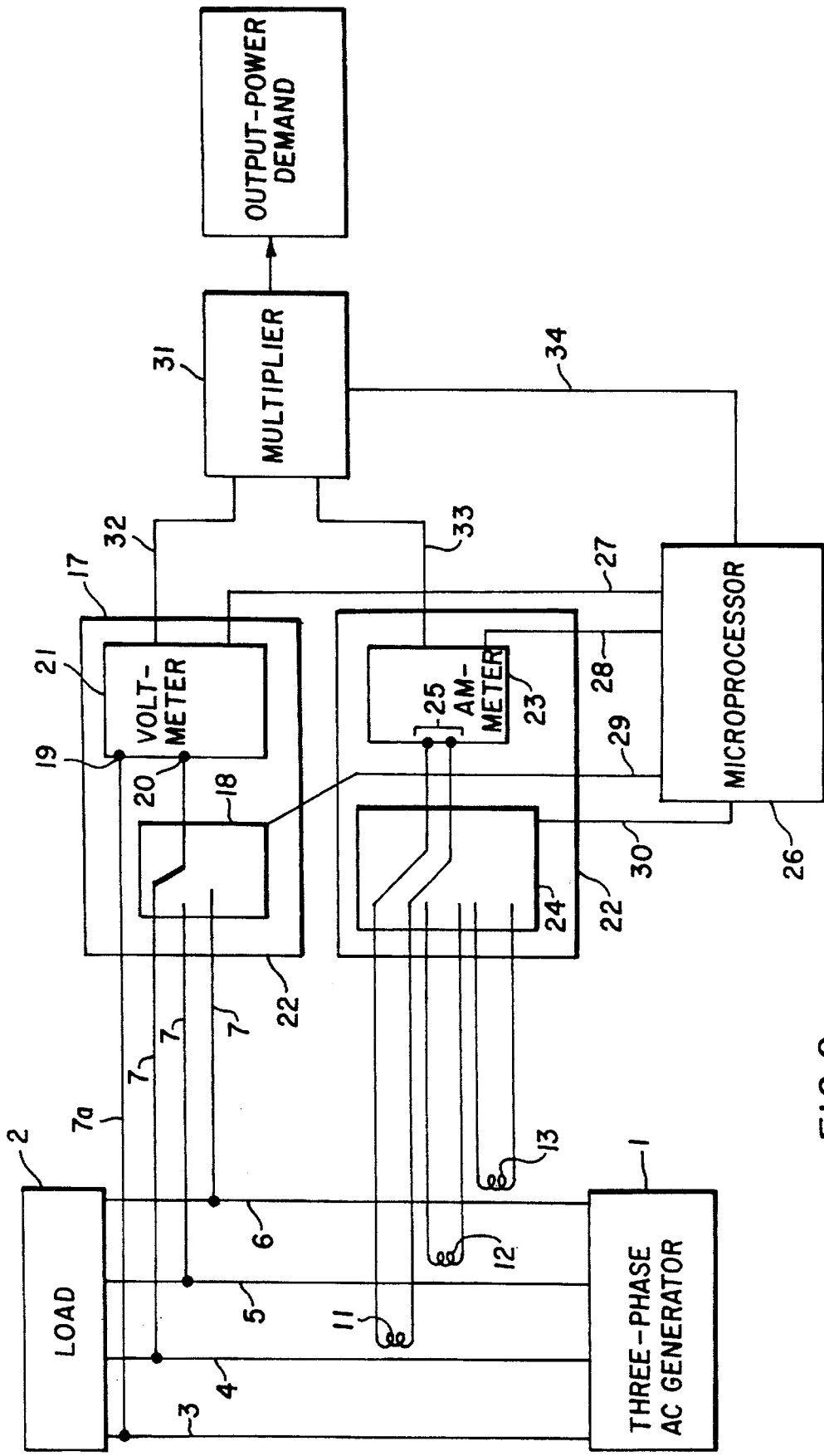
FIG. 2 provides an illustration of the watt/watthour meter of the present invention. The connections between a three-phase, four-line multiphase electrical system and the watt/watthour meter are also shown.

Referring to FIG. 2, the watt/watthour meter of a first embodiment of the present invention is designed to be used with a three-phase, four wire AC system. The watt/watthour meter is adapted to accept voltage inputs from any of a plurality of voltage input lines 7 and from any of a plurality of current sensing coils 11, 12 and 13. Each of the voltage input lines 7 has a voltage applied thereto, where the voltage applied to any one of the voltage input lines 7 is different in phase from the voltage applied to each of the remaining voltage input lines 7. Typically, each of the voltage input lines 7 is connected to a different one of the power lines 4, 5 and 6 in a three phase AC system. A reference voltage input line 7a is also provided and connected to a neutral line 3.

These voltage input lines are then connected to a means 17 for selectively measuring the voltage applied to one of the voltage input lines, where said selective voltage measuring means comprises a voltmeter 21 having a voltage input terminal 20 and a reference voltage input terminal 19, and a switching device 18 which is connected to terminal 20 of the voltmeter 21. The voltage input lines are connected to the switching device 18, and the switching device 18 is used to establish a connection between a selected one of the voltage input lines 7 and voltage input terminal 20 of the voltmeter 21. The reference voltage input line 7a is connected to reference voltage input terminal 19. Voltmeter 21 may then be used to measure the voltage applied to the selected one of the voltage input lines 7 relative to the potential applied to the reference voltage input line 7a.

The current sensing coils 11, 12 and 13 are each adapted to be inductively coupled to one of the power lines 4, 5 and 6 in an AC multiphase system. When one of the coils 11, 12 and 13 is coupled to a power line, a current which is 180° out of phase with the current flowing through the power line is caused to flow through the current sensing coil. Each of the current sensing coils is coupled to a different one of power lines 4, 5 and 6. The current flowing through a given one of the current sensing coils 4, 5 and 6 has a phase which corresponds to the phase of the voltage applied to one of the voltage input lines 7. However, at this point, it is unknown which voltage input line carries a voltage having a phase which corresponds to the phase of the current carried by the given current sensing coil.

If desired, each current sensing could may be viewed as the secondary coil of a conventional current transformer, and the power line to which a current sensing coil is coupled may be viewed as a single-turn primary coil of the transformer. As is well known in the art, the current flowing through the secondary coil of a current transformer (in this case, the current sensing coil) is directly proportional to the current in the primary coil (the power line).

The current sensing coils 11, 12 and 13 are then connected to a means 22 for selectively measuring the current flowing through a selected current input coil.

The selective current measuring means 22 comprises an ammeter 23 and a switching device 24, where the switching device is connected to the ammeter 23 by means of current input terminal 25. The current sensing coils 11, 12 and 13 are each connected to the switching device 24, which is used to establish an electrical connection between a selected one of the current sensing coils 12, 12 and 13 and the ammeter 23. The ammeter 23 may then be used to measure the current flowing through the selected coil.

As previously discussed, before a current measured by the selective current measuring means 22 and a voltage measured by the selective voltage measuring means 17 can be multiplied to produce an accurate measure of power, it must be determined that the measured current and the measured voltage correspond to both the current and voltage carried in a single one of the power lines 4, 5 and 6 of the three phase AC system. Since the voltage and the current in the same power line of a multiphase system are substantially in phase with each other, this may be done by adding a means for comparing the phase of a measured voltage to the phase of a measured current to the watt/watthour meter.

This comparing means is required to sequentially perform the steps of individually comparing the phase of the current flowing through each of the current sensing coils 11, 12 and 13 to the phase of the voltage applied to a selected one of the voltage input lines 7, identifying which one of the current sensing coils 11, 12 and 13 carries a current having a phase which corresponds to the phase of the voltage applied to the selected voltage input line, and storing the information that the voltage in the selected one of the voltage input lines 7 corresponds in phase to the current in the identified one of the current sensing coils 11, 12 and 13. The identified current sensing coil is now said to be aligned with the selected voltage input line. The comparing means performs this process for each of the voltage input lines. Typically, a microprocessor 26 having a memory is used as the comparing means.

As shown in FIG. 2, microprocessor 26 is adapted to receive a voltage input from the voltmeter 21 through line 27 and a current input from the ammeter 23 through line 28. The microprocessor is also able to send signals which control switching devices 18 and 24 through lines 29 and 30, respectively.

The microprocessor 26 determines which of the current sensing coils 11, 12 and 13 carries a current which has a phase corresponding to the phase of the voltage in a selected one of the voltage input lines 7 by sequentially:

a) selecting one of the voltage input lines 7;

b) sending a signal through lines 29 to switching device 18 which causes the selected voltage input wire to be connected to the voltmeter 21;

c) monitoring the sinusoidally varying voltage applied to the selected voltage input line, as measured by voltmeter 21, as a function of time to determine at what specific times the voltage reaches a first defined value;

d) sending a signal to switching device 24 which causes a first one of the current sensing coils 11, 12 and 13 to be connected to the ammeter 23;

e) monitoring the sinusoidally varying current in the first current sensing coil, as measured by ammeter 23 to determine at what specific times the current reaches a second defined value;

f) comparing the times at which the voltage in the selected voltage input line reaches the first defined value to the times at which the current in the first current sensing coil reaches the second defined value to determine whether they are identical;

g) repeating steps (d), (e), and (f) for each of the remaining current input coils 11, 12 and 13 if the times at which the voltage in the selected voltage input line reaches the first defined value and the times at which the current in the first current sensing coil reaches the second defined value are different; and h) storing the information that the phase of the voltage in the selected voltage input line corresponds to the phase of the current in the first current sensing coil if the times at which the current reaches the second defined value are identical to the times at which the voltage reaches the first defined value.

This process is then repeated for each of the remaining voltage input lines.

The first defined value of the voltage and the second defined value of the current discussed above should be selected in such a way that the times at which the voltage and the current reach these values are both essentially independent of the amplitudes of the voltage and the current. The simplest choice for the first defined value of the voltage is zero, as both the value of the voltage and the time at which the voltage reaches the defined value are independent of voltage amplitude in this case. If the first defined value of the voltage is zero, the second defined value of the voltage should also be selected to be zero. The process of determining if a current sensing coil carries a current having a phase which corresponds to the phase of the voltage in the selected voltage input line is then done by determining the times at which the voltage applied to the selected voltage input line reaches zero, determining the times at which the current running through the current sensing coil reaches zero, and comparing the times at which the voltage reaches zero to the times at which the current reaches zero.

If desired, other values may be chosen for the first defined value of the voltage and the second defined value of the current. Since the peak value of the voltage and the peak value of the current occur at the same times regardless of the amplitudes of the voltage and the current, they may be conveniently be used as the first and second defined value. Similarly, the first defined value of the voltage may be selected to be a first defined percentage of the peak voltage, and the second defined value of the current may be selected to be a second defined percentage of the peak current, where the first and second percentages are equal.

As noted in the background of the invention, the current running through a given one of the current sensing coils 11, 12 and 13 may be either 0° or 180° out of phase with the voltage in a voltage input wire which is connected to the same power line as the given coil. If they are 180° out of phase, a negative power will erroneously result when they are multiplied. Therefore, the phase of the current in each current sensing coil must be checked and, if necessary, corrected to bring it into phase with the voltage in the voltage input line which has been aligned with the given coil.

This task of checking the current phase and, if necessary, correcting it, may also be performed by microprocessor 26. The microprocessor 26 causes ammeter 23 to measure the current flowing through the given current sensing coil at a specific point in time $t_1$ and determines whether the current at time $t_1$ is positive or negative. At the same specific time $t_1$, the microprocessor also causes voltmeter 21 to measure the voltage applied to the voltage input line which carries a voltage corresponding in phase to the current carried by the given current sensing coil. The microprocessor 26 then determines whether the voltage measured at time $t_1$ is positive or negative. If the voltage and the current are both positive or both negative at time $t_1$, the microprocessor stores the information that the current and voltage are in phase with each other. If the current and voltage have different signs at time $t_1$, the microprocessor stores the information that the current and the voltage are 180° out of phase, and that the current must be multiplied by $-1$ prior to calculating power.

The next major component of the watt/watthour meter is a multiplier circuit 31. The multiplier circuit 31 accepts a voltage input through line 32 from the voltmeter 21 and a current input through line 33 from the ammeter 23 and multiplies them to produce a measure of power. The measurement is then provided as an output. The microprocessor 26 is connected to the multiplier through line 34.

Figure 3:
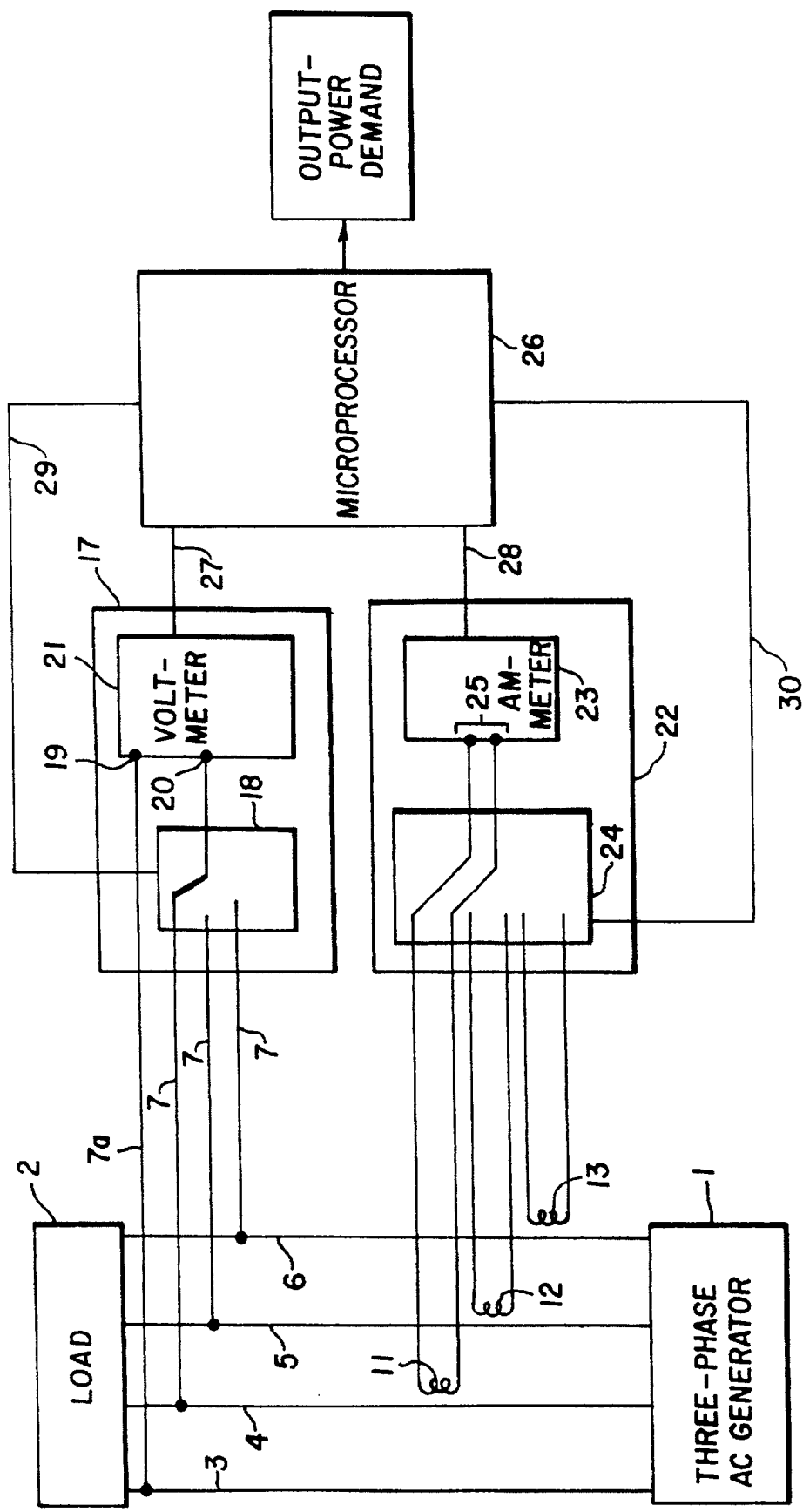
FIG. 3 provides an illustration of a second embodiment of the present invention and its connections to a three-phase, four line multiphase electrical system.

Alternatively, the watt/watthour meter may not feature a separate multiplier circuit 31. Instead, microprocessor 26 may be programmed so as to allow it to accept a voltage input through line 27 from the voltmeter and a current input through line 28 from the ammeter, and then multiply the current and the voltage to derive a measure of power. The microprocessor may then provide the measure of power as an output. This arrangement is shown in FIG. 3.

Returning to FIG. 2, power in a single phase of the multiphase system is calculated as follows. The microprocessor 26 accesses its memory and determines which one of the current sensing coils 11, 12 and 13 is aligned with a given one of the voltage input lines 7, and then causes switching devices 18 and 24 to connect the given voltage input line to the voltmeter 21 and the aligned current sensing coil to the ammeter 23. The ammeter 23 measures the current in the aligned current sensing coil and transmits this information to the multiplier 31. The voltmeter 21 similarly measures the voltage in the given voltage input line and transmits the measured voltage to the multiplier 31. The microprocessor 26 then accesses its memory a second time and determines whether the voltage in the given voltage input line and the current in the aligned current sensing coil are 180° out of phase. If they are, the microprocessor 26 sends a signal through line 34 to the multiplier 31 which causes the multiplier to correct the phase of the current by multiplying the measured current by $-1$. The voltage and the phase-corrected current are then multiplied by the multiplier 31 to obtain a measure of power in a single phase of the system. A means for adding this power to the power in each of the remaining phases of the system may be used to obtain a measure of the total power demand on the multiphase system. If it is desired to use the apparatus of FIG. 3, the steps of receiving a current input and a voltage input, correcting the phase of the current, and multiplying the phase-corrected current and the voltage may be performed by microprocessor 26 rather than by a separate multiplier.

Figure 4:
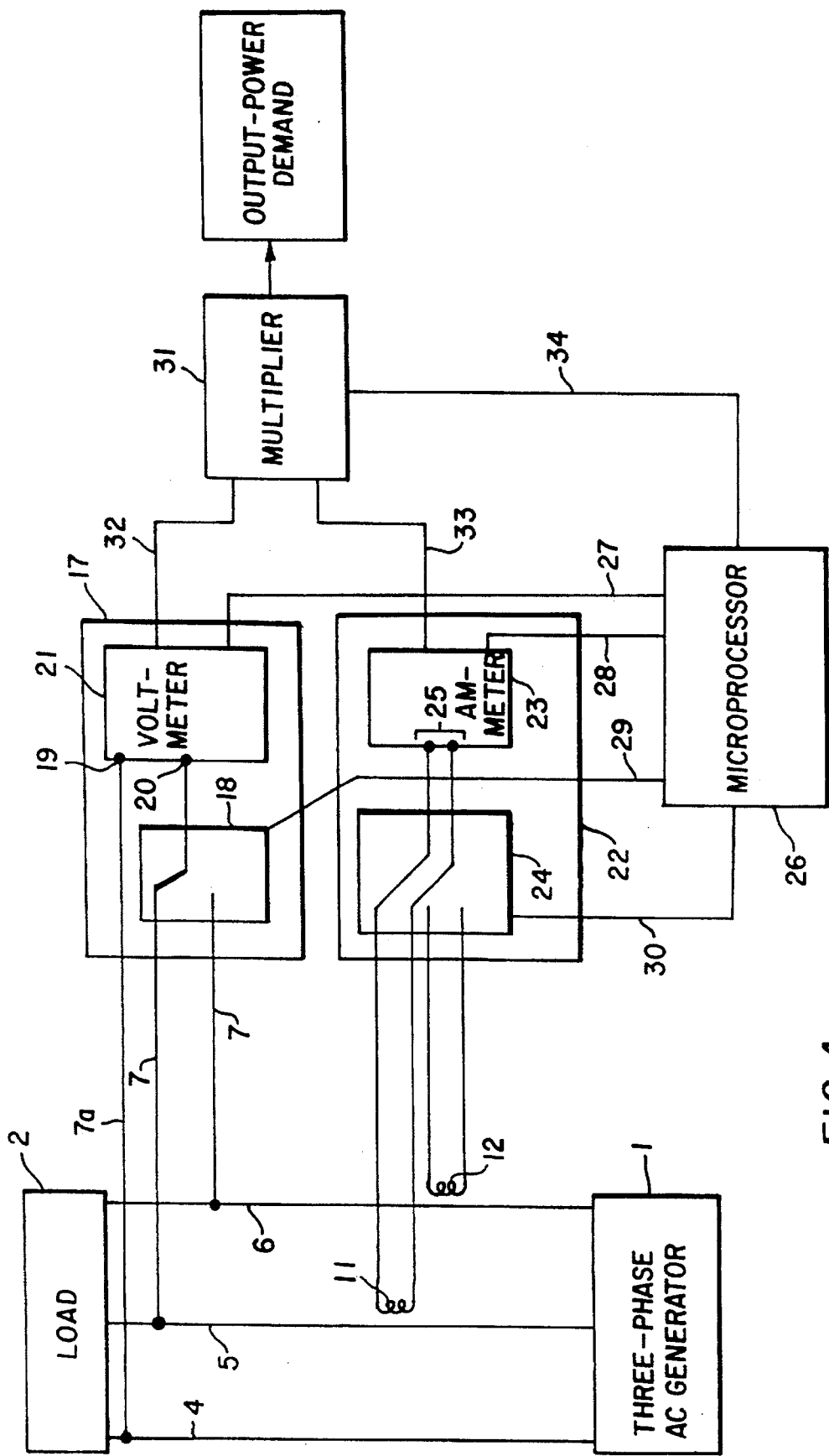
FIG. 4 provides an illustration of the watt/watthour meter of the present invention and its connections to a three-phase, three-line multiphase electrical system.

In a third embodiment of the invention, the watt/watthour meter may be designed to be used with a three phase, three wire system. The wattmeter is connected to a three line system in essentially the same way as to a four line system, except that only two voltage input lines and two current sensing coils are used in the three line system, while three voltage input lines and three current sensing coils are needed for the four wire system. In the three phase, three line system, no neutral power line 3 is present. Therefore, reference voltage input line 7a must be connected to one of the three power lines 4, 5 and 6. The power line to which 7a is connected is not connected to either the selective current measuring means 22 or the selective voltage measuring means 17. Each of the remaining power lines is connected to selective voltage measuring means by means of a voltage input wire 7, and to selective current measuring means 22 by means of a current sensing coil. FIG. 4 provides an outline of a watt/watthour meter for operation with a three-wire system, where any part which has the same number as a part from FIG. 2 performs the same function as the part from FIG. 2.

The voltage input lines in the three wire system carry voltages which differ in phase by 120°. In a four sire system, the voltage in a first voltage input wire differs in phase by 120° from the voltage in a second voltage input wire and by 240° from the voltage in a third voltage input wire. If it is desired to know the phase difference between the voltages in two voltage input lines in a four wire system, the microprocessor may be used to measure the phase difference between the two voltages and store this information in memory.

This feature allows the operator of the watt/watthour meter to specifically identify each voltage input line which is connected to a three phase, four line system according to the phase of the voltage applied thereto. This is done by arbitrarily selecting one of the voltage input lines 7 and designating that input line as Line 1. The phase of the voltage applied to Line 1 is then measured by the microprocessor and compared to the phase of the voltage applied to each of the remaining two voltage input lines. The microprocessor then determines which of the remaining voltage input lines carries a voltage which is 120° out of phase with the voltage applied to Line 1 and designates this input line as Line 2. By a process of elimination, the third voltage input line is assumed to carry a voltage which is 240° out of phase with the voltage applied to Line 1, and is therefore designated as Line 3. These line designations are stored in the microprocessor's memory. Each current sensing coil may also be designated with a current input number which corresponds to the number of the voltage input line with which it is aligned.

The watt/watthour meter of the present invention may be used with a given multiphase system on a temporary or permanent basis. If temporary usage is desired, the voltage input lines and the current sensing coils of the watt/watthour meter are designed so that they may be easily and rapidly connected to the power lines of a multiphase system when it is desired to measure the power in the system, and then equally rapidly disconnected from the multiphase system and stored for future use or connected to a different multiphase system. If permanent usage is required, the voltage input lines and the current sensing coils may be permanently wired to the power lines of the multiphase system.

What is claimed is:

1. An apparatus for measuring power consumption in a multiphase alternating current system, comprising:

a) a plurality of voltage input lines, each voltage input line being adapted to have a voltage applied thereto, where the voltage applied to any one of the voltage input lines is different in phase from the voltage applied to each of the remaining voltage input lines;

b) a means for selectively measuring the voltage applied to any one of the voltage input lines;

c) a plurality of current sensing coils, each of said current sensing coils being adapted to be inductively coupled to a current-carrying second coil so as to cause a current to flow through the current sensing coil; further characterized in that the phase of the current flowing through each current sensing coil corresponds to the phase of the voltage applied to one of the voltage input lines and in that the current flowing through any one of the current sensing coils is different in phase from the current flowing through each of the remaining current sensing coils;

d) a means for selectively measuring the current flowing through any one of the current sensing coils;

e) a means for aligning each of said current sensing coils with one of said voltage input lines without having to correct wiring anomalies by comparing the phase of the current flowing through each of said current sensing coils to the phase of the voltage applied to a selected voltage input line; identifying a current sensing coil which has a current which corresponds in phase to the voltage applied to the selected voltage input line; storing the information that the phase of the voltage applied to the selected voltage input line corresponds to the phase of the current flowing through the identified the processing coil; and repeating the process for each of the remaining voltage input lines; and, f) a means for measuring power in a single phase of the multiphase system comprising:

i) a means for causing the selective voltage measuring means to measure the voltage applied to a desired voltage input wire;

ii) a means for causing the selective current measuring means to measure the current running through the current sensing coil which has been identified as carrying a current which corresponds in phase to the voltage in the desired voltage input line; and, iii) a means for multiplying the measured voltage and the measured current to obtain a measure of power.

2. The apparatus of claim 1, where said aligning means is a microprocessor having a memory, characterized in that the microprocessor performs the steps of:

a) selecting one of said voltage input lines;

b) monitoring the voltage applied to the selected voltage input line as a function of time to determine the times at which the voltage in the selected input line reaches a first defined value;

c) sequentially monitoring the current running through each of the current input coils as a function of time to individually determine the times at which the current running through each of the current input coils reaches a second defined value;

d) identifying a current sensing coil having a current which reaches the second defined value at the same time that the voltage applied to the selected voltage input line reaches the first defined value flowing therethrough;

e) storing the information that the current flowing through the identified current sensing coil corresponds in phase to the voltage applied to the selected voltage input line; and, f) repeating steps (a), (b), (c), (d), and (e) for each of the remaining voltage input lines.

3. The apparatus of claim 2, where the first defined value is zero and the second defined value is zero.

4. The apparatus of claim 2, where the microprocessor additionally determines whether the current in the identified current sensing coil is in phase with the voltage applied to the selected voltage input line or 180° out of phase with the voltage applied to the selected voltage input line.

5. The apparatus of claim 3, where the microprocessor inverts the phase of the current in the identified current sensing coil if and only if it is determined to be 180° out of phase with the voltage applied to the selected voltage input line.

6. The apparatus of claim 4, where the microprocessor inverts the phase of the current in the identified current sensing coil by causing the current in the identified current sensing coil to be multiplied by −1.

7. The apparatus of claim 1, further characterized in that the apparatus comprises three voltage input lines and three current sensing coils, where the voltage applied to a first voltage input line is 120° out of phase with the voltage applied to a second voltage input line and 240° out of phase with the voltage applied to a third voltage input line.

8. The apparatus of claim 1, further characterized in that the apparatus comprises two voltage input lines and two current sensing coils, where the voltage applied to a first voltage input line is 120° out of phase with the voltage applied to a second voltage input line.

9. The apparatus of claim 6, further comprising a microprocessor which is capable of measuring the phase difference between the voltage applied to a first voltage input line and the voltage applied to a second voltage input line and storing this information.

10. The apparatus of claim 1, further characterized in that the voltage input lines and current sensing coils are adapted to be permanently connected to the power lines of a specific multiphase AC system.

11. The apparatus of claim 1, further characterized in that the voltage input lines and the current sensing coils are adapted to be temporarily connected to the power lines of a given multiphase AC system, so that the current sensing coils and voltage input lines can be disconnected from the power lines of the given multiphase AC system and reconnected to the power lines of a different multiphase AC system, allowing a single apparatus to be used with a plurality of multiphase AC systems.

* * * * *